United States Patent [19]

Matsuura

[11] Patent Number: 4,668,882
[45] Date of Patent: May 26, 1987

[54] RADIO FREQUENCY SIGNAL VARIABLE ATTENUATION CIRCUIT

[75] Inventor: Syuuji Matsuura, Ikoma, Japan

[73] Assignee: Sharp Kabushiki Kaisha, Osaka, Japan

[21] Appl. No.: 741,596

[22] Filed: Jun. 5, 1985

[30] Foreign Application Priority Data

Jun. 6, 1984 [JP] Japan ............... 59-117495

[51] Int. Cl.⁴ ............... H03K 5/08; H03H 7/25
[52] U.S. Cl. ............... 307/540; 307/565; 307/320; 333/81 R
[58] Field of Search ............... 307/540, 555, 559, 561, 307/565, 317 R, 320; 333/81 R, 81 A

[56] References Cited

U.S. PATENT DOCUMENTS

| | | | |
|---|---|---|---|
| 3,529,266 | 9/1970 | King | 307/565 |
| 3,577,103 | 5/1971 | Sparks | 333/81 R |
| 3,846,724 | 11/1974 | Maier | 333/81 A |
| 3,921,106 | 11/1975 | Williams | 333/81 A |
| 4,019,160 | 4/1977 | Kam | 333/81 R |
| 4,097,827 | 6/1978 | Williams | 333/81 A |
| 4,220,874 | 9/1980 | Iwata et al. | 307/317 R |
| 4,224,583 | 9/1980 | Larkin | 333/81 R |

*Primary Examiner*—John Zazworsky
*Attorney, Agent, or Firm*—Birch, Stewart, Kolasch and Birch

[57] ABSTRACT

An RF signal variable attenuation circuit is disclosed having an input terminal for inputting RF signals, an output terminal for outputing attenuated signals, a transmission line connected between the input terminal and the output terminal, first and second PIN diodes inserted in the transmission line in series, a power supply source for supplying a voltage to the first and second PIN diodes, and a control circuit for controlling the conduction of the first and second PIN diodes according to the voltage supplied from the power supply source.

7 Claims, 5 Drawing Figures

U.S. Patent
May 26, 1987
4,668,882
FIG. 1
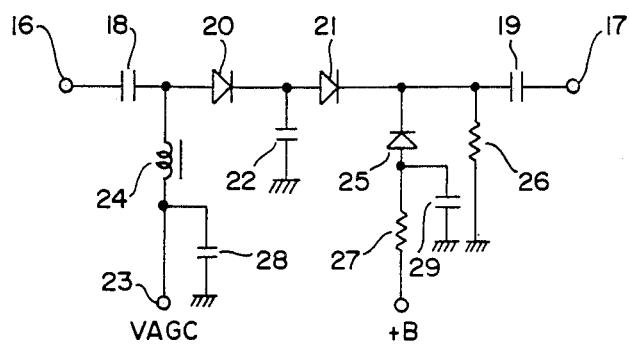
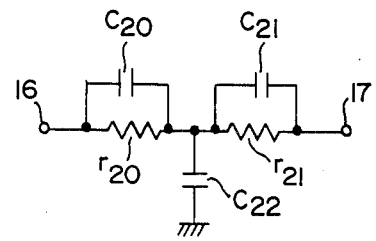
FIG. 3(a)
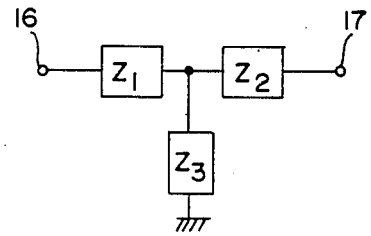
FIG. 3(b)
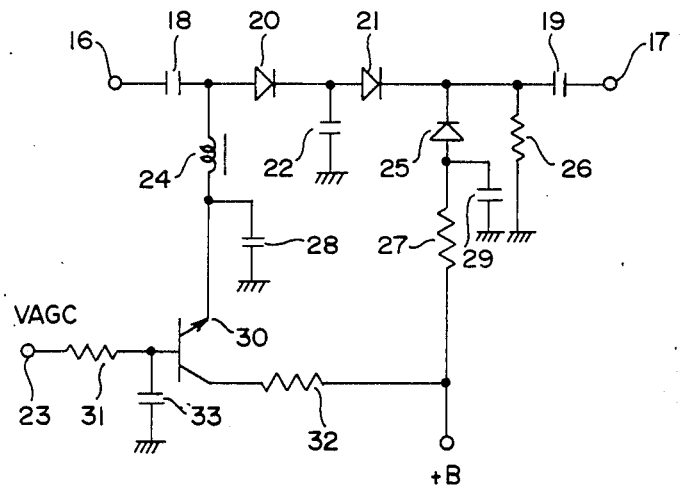
FIG. 2
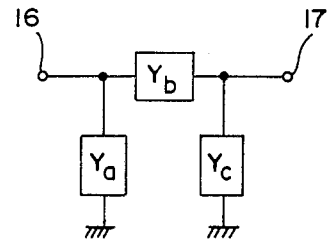
FIG. 3(c)

RADIO FREQUENCY SIGNAL VARIABLE ATTENUATION CIRCUIT

BACKGROUND OF THE INVENTION

The present invention relates to a radio-frequency (RF) signal variable attenuation circuit and, more particularly, to an improved RF signal variable attenuation circuit including a PIN diode which can be used in a converter for a double super heterodyne system, an input circuit for an electronic tuner, a booster, or an antenna system, etc.

In the conventional RF signal variable attenuation circuits, the amount of attenuation varies greatly according to the transmission frequencies.

It is desired, therefore, that an improved wide-band type RF signal variable the amount of attenuation circuit be provided for preventing the variation of attenuation according to applied frequency.

SUMMARY OF THE INVENTION

Accordingly, it is an object of the present invention to provide an improved RF signal variable attenuation circuit which can exactly attenuate even when the applied frequency varies.

It is another object of the present invention to provide an improved RF signal variable attenuation circuit which can improve upon the reduction of characteristics of the circuit at the high band area which is produced by a junction capacitance of PIN diode.

It is still another embodiment of the present invention to provide an improved RF signal variable attenuation circuit which does not change the amount of attenuation according to the frequency of the applied signal.

It is a further object of the present invention to provide an improved RF signal variable attenuation circuit which can properly attenuate a signal by a desired amount of the whole band area.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve these objects, according to an embodiment of the present invention, an RF signal variable attenuation circuit is characterized in that first and second PIN diodes are connected to a signal line in series, the connection between the first and second PIN diodes is grounded through a condenser having a small capacitance, one end of the series circuit of the first and second PIN diodes is connected to a third PIN diode and a bias resistance, a fixed bias power is supplied to the third PIN diode, a control signal is supplied to the other end of the serial circuit of the first and second PIN diodes so that an RF input signal is attenuated by controlling the conduction of the PIN diode according to the control signal.

BRIEF DISCLOSURE OF THE DRAWINGS

The present invention will be better understood from the detailed description given hereinbelow and the accompanying drawings which are given by way of illustration only, and thus are not limitative of the present invention and wherein:

FIG. 1 illustrates a circuit diagram of an RF signal variable attenuation circuit according to an embodiment of the present invention;

FIG. 2 illustrates a circuit diagram of an RF signal variable attenuation circuit according to another embodiment of the present invention; and FIGS. 3(a) through 3(c) show simple equivalent circuits of a resistance circuit of the RF signal variable attenuation circuit of FIG. 1.

DETAILED DESCRIPTION OF THE INVENTION

FIG. 1 shows a circuit diagram of an RF (Radio Frequency) signal variable attenuation circuit according to an embodiment of the present invention. Two condensers 18 and 19, for blocking a direct current, and two PIN doides 20 and 21 are inserted into a signal line as a signal transmission line connected between an input terminal 16 and an output terminal 17 in series. The connection between the PIN diodes 20 and 21 is grounded through a condenser 22 having a small capacitance. An AGC (automatic gain control) voltage $V_{AGC}$ from an AGC (automatic gain control) terminal 23 is applied to an anode of the PIN diode 20 through a peaking coil 24. On the other hand, a cathode of the PIN diode 21 is connected to a cathode of a third PIN diode 25 and is grounded via a bias resistance 26. A positive power voltage from a power supply source +B is applied to an anode of the third PIN diode 25 through a bias resistance 27. Reference numerals 28 and 29 designate condensers for ground.

In the RF signal variable attenuation circuit having above construction, three PIN diode 20, 21 and 25 form an L-type resistance circuit. When the maximum gain is shown, a relatively high positive voltage is applied to the AGC terminal 23. In this time, the inner resistances $V_{20}$ and $V_{21}$ of the PIN diodes 20 and 21 are about several ohms, but the inner resistance $V_{25}$ of the third PIN diode 25 is about several hundred ohms. Accordingly, the RF signals input from the input terminal 16 are not attenuated and outputted from the output terminal 17 through the condenser 18 and the PIN diodes 20 and 21 and the condenser 19.

On the other hand, when the minimum gain is shown, the AGC voltage applied to the AGC terminal 16 is zero volt. In this case, the inner resistances $V_{20}$ and $V_{21}$ of the PIN diodes 20 and 21 are about several K ohms, but the inner resistance $V_{25}$ of the PIN diode 25 is about several ten ohms. The RF signals applied to the input terminal 16 are attenuated with an attenuation amount more than 30 dB by the L type resistance circuit including the three PIN diodes 20, 21, and 25.

In the RF signal variable attenuation circuit according to the embodiment of the present invention, the conduction of the two PIN diodes 20 and 21 is controlled according to the AGC voltage applied to the AGC terminal 23. As a result, the RF input signals applied to the input terminal 16 are attenuated by a desired amount and the attenuated signals are outputted from the output terminal 17.

In the above RF signal variable attenuation circuit, an equivalent circuit of the resistance circuit of the FIG. 1, is shown in FIG. 3(a) when the minimum gain is shown. In this case, the variable attenuation circuit comprises inner resistances $V_{20}$ and $V_{21}$ of the PIN diodes 20 and 21, junction capacitances $C_{20}$ and $C_{21}$ of the PIN diodes 20 and 21, and a capacitance $C_{22}$ of the condenser 22.

The equivalent circuit as shown in FIG. 3(a) is converted into circuits as shown in FIGS. 3(b) and 3(c) by using a Y−Δ equivalent transformation rule. Z1, Z2 and Z3 designate impedances, and Ya, Yb and Yc designate admittances.

In this case, the component $Y_b$ after conversion is expressed by the impedances Z1, Z2 and Z3 as follows.

$$Y_b = Z_3/(Z_1Z_3 + Z_3Z_2 + Z_2Z_1)$$

Referring to the above equation, the junction capacitances C20 and C21 of the PIN diodes 20 and 21 are actually decreased by the capacitance C22 of the condenser 22.

As described above, because the connection between the PIN diodes 20 and 21 is grounded thriough the condenser 22 having a small capacitance, the reduction of characteristic at the high frequency area due to the influence of the junction capacitance of the PIN diodes 20 and 21, when the minimum gain is shown, is improved.

In the circuit of FIG. 1, an attenuation amount of more than about 30 dB can be obtained over the wide-band area between about 50 MHz and about 500 MHz when the minimum gain is shown.

FIG. 2 shows a circuit diagram of an RF signal attenuation circuit according to another embodiment of the present invention where like components are designated by the same symbols as in FIG. 1. A buffer amplifier circuit is additionally provided in the circuit of FIG. 2. The buffer amplifier circuit comprises a transistor 30, resistances 31 and 32 and a condenser 33. The AGC voltage, $V_{AGC}$, from the AGC terminal 23 is applied to a base of the transistor 30 through the resistance 31 so that the conduction of the transistor 30 is controlled. By the above operation, a DC (direct current) voltage according to the AGC voltage $V_{AGC}$ is applied to the anode of the PIN diode 20 through the peaking coil 24.

The attenuation operation of the RF signals in the embodiment of the present invention is the same as that of the circuit of FIG. 1. In this case, the variable attenuation operation is exactly and efficiently carried out against a relatively small variation of the AGC voltage, $V_{AGC}$.

As described above, according to the present invention, in the RF signal attenuation circuit in which the PIN diodes are inserted in the signal line, the conduction of the PIN diodes is variably controlled based on the AGC voltage so that the RF input signals are attenuated by a suitable amount, the connection of the two PIN diodes is grounded through the condenser having a small capacitance. Therefore, the characteristic reduction at the high-band area produced by the junction capacity of the PIN diodes is improved. It is possible to obtain an attenuation characteristic (loss and profit) of more than about 30 dB over the wide-band area, for example, between about 50 MHz and about 500 MHz.

The RF signal variable attenuation circuit of the present invention can be applied to an input stage of a high frequency amplifier circuit of an up/down converter.

In the RF signal variable attenuation circuit including PIN diodes according to the present invention, an AGC voltage is applied to an AGC terminal according to the level of the input signals, and the suitable RF signals are always outputted after being attenuated by the suitable amount, the amount of attenuation varying according to the applied AGC voltage.

Preferably, the capacitance of the condenser 22 may be about 1 picofarad.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An RF signal variable attenuation circuit for attenuation RF signals comprising:
   input means for inputting RF signals;
   output means for outputting attenuated output signals;
   line means connected between said input and output means for transmitting RF signals;
   first and second diodes inserted in said line means in a series connection, said first diode being connected to said input means at a first side of said series connection and said second diode being connected to said output means at a second side of said series connection;
   condenser means for grounding the connection between the first and second diode;
   a third diode connected to said second diode at said second side of said series connection;
   power supply means for supplying a voltage to the third diode; and
   control signal supply means for supplying a control signal to said first diode at said first side of said series connection,
   wherein the conduction of the first and second diodes is controlled according to the control signal from the control signal supply means.

2. The RF signal variable attenuation circuit of claim 1, further comprising resistance connected to the third diode.

3. The RF signal variable attenuation circuit of claim 1, wherein the power supply means is a fixed bias power source.

4. The RF signal variable attenuation circuit of claim 1, wherein each of the first, second and third diodes is a PIN diode.

5. The RF signal variable attenuation circuit of claim 1, wherein the condenser means has a small capacitance.

6. The RF signal variable attenuation circuit of claim 5, wherein the capacitance of the condenser means is about 1 picofarad.

7. The RF signal variable attenuation circuit of claim 1 wherein said control signal supply means comprises a buffer amplifier circuit, said buffer amplifier circuit including a transistor having a base connected to an automatic gain control terminal and an emitter for outputting said control signal.

* * * * *